United States Patent [19]
Fujimoto

[11] Patent Number: 5,960,225
[45] Date of Patent: Sep. 28, 1999

[54] SUBSTRATE TREATMENT APPARATUS

[75] Inventor: Akihiro Fujimoto, Kumamoto-ken, Japan

[73] Assignee: Tokyo Electron Limited, Tokyo, Japan

[21] Appl. No.: 08/984,082

[22] Filed: Dec. 3, 1997

[30] Foreign Application Priority Data

Dec. 3, 1996 [JP] Japan .................................. 8-323166

[51] Int. Cl.⁶ ................................................. G03D 5/00
[52] U.S. Cl. ......................................... 396/611; 396/627
[58] Field of Search ................................... 396/604, 611, 396/626, 627; 118/52, 302, 313, 319, 320, 321, 500, 501, 504, 676, 677, 712; 427/422

[56] References Cited

U.S. PATENT DOCUMENTS

| | | | |
|---|---|---|---|
| 5,002,008 | 3/1991 | Ushijima et al. | 118/52 |
| 5,250,114 | 10/1993 | Konishi et al. | 118/321 |
| 5,489,337 | 2/1996 | Nomura et al. | 118/677 |
| 5,664,254 | 9/1997 | Ohkura et al. | 396/612 |
| 5,672,205 | 9/1997 | Fujimoto et al. | 118/313 |

*Primary Examiner*—D. Rutledge
*Attorney, Agent, or Firm*—Oblon, Spivak, McClelland, Maier & Neustadt, P.C.

[57] ABSTRACT

A substrate treatment apparatus comprises an arm holder for substantially horizontally holding each of substrates, a substrate transfer mechanism, having a vertical shaft, for moving the arm holder along the vertical shaft, swinging the arm holder about the vertical shaft, and horizontally advancing and retreating the arm holder, a first liquid process unit including a casing, a substrate carry-in/carry-out port formed in the casing and permitting a first substrate to be carried therethrough together with the arm holder, and a plurality of treatment members contained in the casing for treating the first substrate with a liquid, and a second liquid process unit located adjacent to the first liquid process unit, and including the casing, a substrate carry-in/carry-out port formed in the casing and permitting a first substrate to be carried therethrough together with the arm holder, and a plurality of treatment members contained in the casing for treating the second substrate with a liquid. Each of the treatment members of the first liquid process unit and a corresponding one of the treatment members of the second liquid process unit are arranged symmetrical on a horizontal plane with respect to the arm holder.

19 Claims, 10 Drawing Sheets

SUBSTRATE TREATMENT APPARATUS

BACKGROUND OF THE INVENTION

This invention relates to a substrate treatment apparatus for applying a liquid resist or a developer to a substrate such as a semiconductor wafer.

Photolithography is used in a process for manufacturing semiconductor devices. In this technique, a resist is coated onto a semiconductor wafer, and the coated resist is subjected to an exposure treatment so as to have a predetermined pattern, and then to a developing treatment. As a result, a resist film of a predetermined pattern is formed. Thereafter, further film forming and etching are performed to form a circuit of a predetermined pattern. A series of resist treatments as above is performed using, for example, a coating/developing treatment system as described in U.S. Pat. No. 5,664,254. This conventional system has two resist coating units to enhance the throughput. More specifically, in this system, two unit chambers 101 and 102 are provided at the same level and adjacent to each other, and a main arm mechanism 22 is provided on an extended line of the boundary between the chambers, as is shown in FIG. 1. The main arm mechanism 22 comprises a Z-axis driving mechanism for vertically moving an arm holder 48, a rotary mechanism for moving the arm holder 48 through an angle θ about the Z-axis, and an advancing/retreating mechanism for advancing and retreating the arm holder 48. A spin chuck 105 is provided at a substantially center portion of each of the unit chambers 101 and 102. Further, a resist coating unit 106 and a side rinse unit 107 are provided at opposite side portions of each of the chambers 101 and 102.

For example, to carry a wafer W into the unit chamber 101 by the main arm mechanism 22, the arm holder 48 is raised to the same level as the chamber 101, then swung about the Z-axis, and extended and inserted into the chamber 101 through a chamber inlet 103 to thereby place the wafer W on the spin chuck 105 therein. On the other hand, to carry the wafer W into the other unit chamber 102 by the main arm mechanism 22, the arm holder 48 is raised to the same level as the chamber 102, then swung about the Z-axis, and extended and inserted into the chamber 102 through a chamber inlet 104 to thereby place the wafer W on the spin chuck 105 therein.

Since, however, the resist coating unit 106 and the side rinse unit 107 have different sizes, the arm holder 48 must be swung through different angles θ 1 and θ 2 and extended over different distances between the case where it transfers the wafer W into the first chamber 101 and the case where it transfers it into the second chamber 102. To this end, the main arm mechanism 22 and software for controlling the operation of the mechanism 22 must be made complicated, which results in a high cost.

BRIEF SUMMARY OF THE INVENTION

It is the object of the invention to provide a substrate treatment apparatus which has a cheap and simple main arm mechanism and software for controlling it.

According to a first aspect of the invention, there is provided a substrate treatment apparatus comprising: an arm holder for substantially horizontally holding each of substrates to be treated; a substrate transfer mechanism, having a vertical shaft, for moving the arm holder along the vertical shaft, swinging the arm holder about the vertical shaft, and horizontally advancing and retreating the arm holder; a first liquid process unit including a casing, a substrate carry-in/carry-out port formed in the casing and permitting a first substrate to be carried therethrough together with the arm holder, and a plurality of treatment members contained in the casing for treating the first substrate with a liquid; and a second liquid process unit located adjacent to the first liquid process unit, and including the casing, a substrate carry-in/carry-out port formed in the casing and permitting a first substrate to be carried therethrough together with the arm holder, and a plurality of treatment members contained in the casing for treating the second substrate with a liquid; wherein each of the treatment members of the first liquid process unit and a corresponding one of the treatment members of the second liquid process unit are arranged symmetrical on a horizontal plane with respect to the arm holder.

According to a second aspect of the invention, there is provided a substrate treatment apparatus comprising: an arm holder for substantially horizontally holding each of substrates to be treated; a substrate transfer mechanism, having a vertical shaft, for moving the arm holder along the vertical shaft, swinging the arm holder about the vertical shaft, and horizontally advancing and retreating the arm holder; a first liquid process unit including a casing, and a substrate carry-in/carry-out port formed in the casing and permitting a first substrate to be carried therethrough together with the arm holder; a first spin chuck included in the first liquid process unit for rotating the first substrate transferred from the arm holder; a first cup surrounding the first spin chuck; a movable first nozzle section included in the first liquid process unit for applying a treatment liquid to the first substrate on the first spin chuck to treat it; a first nozzle stand-by section in which the first nozzle section stands by when it is not used; a first nozzle operating mechanism for moving the first nozzle section between the first nozzle stand-by section and the first spin chuck; a second liquid process unit located adjacent to the first liquid process unit and symmetrical in a horizontal plane with respect to the arm holder, and including a casing and a substrate carry-in/carry-out port formed in the casing and permitting a first substrate to be carried therethrough together with the arm holder; a second spin chuck included in the second liquid process unit for rotating the substrate transferred from the arm holder; a second cup surrounding the second spin chuck; a movable second nozzle section included in the second liquid process unit for applying a treatment liquid to the substrate on the second spin chuck to treat it; a second nozzle stand-by section in which the second nozzle section stands by when it is not used; and a second nozzle operating mechanism for moving the second nozzle section between the second nozzle stand-by section and the second spin chuck; wherein the first spin chuck, the first cup, the first nozzle section, the first nozzle stand-by section and the first nozzle operating mechanism, and the second spin chuck, the second cup, the second nozzle section, the second nozzle stand-by section and the second nozzle operating mechanism are arranged symmetrical in a horizontal plane with respect to the arm holder, respectively.

In the invention, each treatment element in the first liquid process unit and a corresponding one in the second liquid process unit are located at the same distance from the arm holder and symmetrical with respect to it. Specifically, as is shown in FIG. 6, each treatment element in the first liquid process unit (COT1) and a corresponding one in the second liquid process unit (COT2) are laid out symmetrical with respect to a center line CL which is parallel to the X-axis. Accordingly, the swing angle α and the stroke S of the arm holder 48 can be set to identical values when it transfers a wafer W into the first unit (COT1) and into the second unit (COT2). As a result, the main arm mechanism (substrate transfer mechanism) 22 can be made cheap and simple in structure in terms of both hardware and software.

In addition, it is desirable that the liquid discharge ports of first and second side rinse nozzles incorporated in the first and second liquid process units face opposite directions. In this case, while first and second substrates are rotated in the same direction by the first and second spin chucks, the first and second side rinse nozzles can apply a rinse to edge portions of the first and second substrates in accordance with their rotation, respectively. Therefore, even when rinse treatment errors occur on the first and second substrates, they occur in the same direction and hence can be dealt with easily.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The preferred embodiments of the invention will be described with reference to the accompanying drawings.

Figure 1:
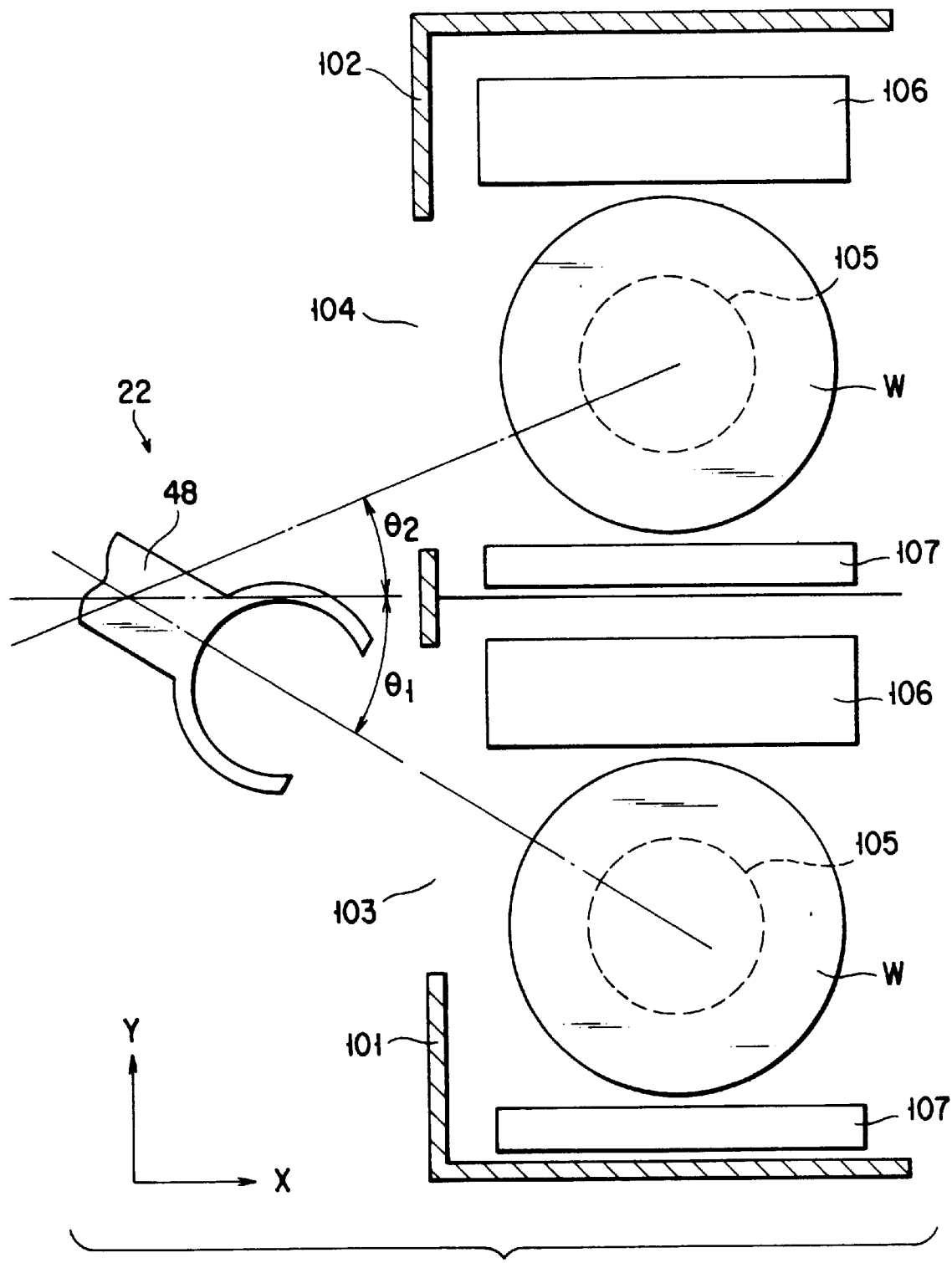
FIG. 1 is a schematic plan view, showing a conventional apparatus.
Figure 2:
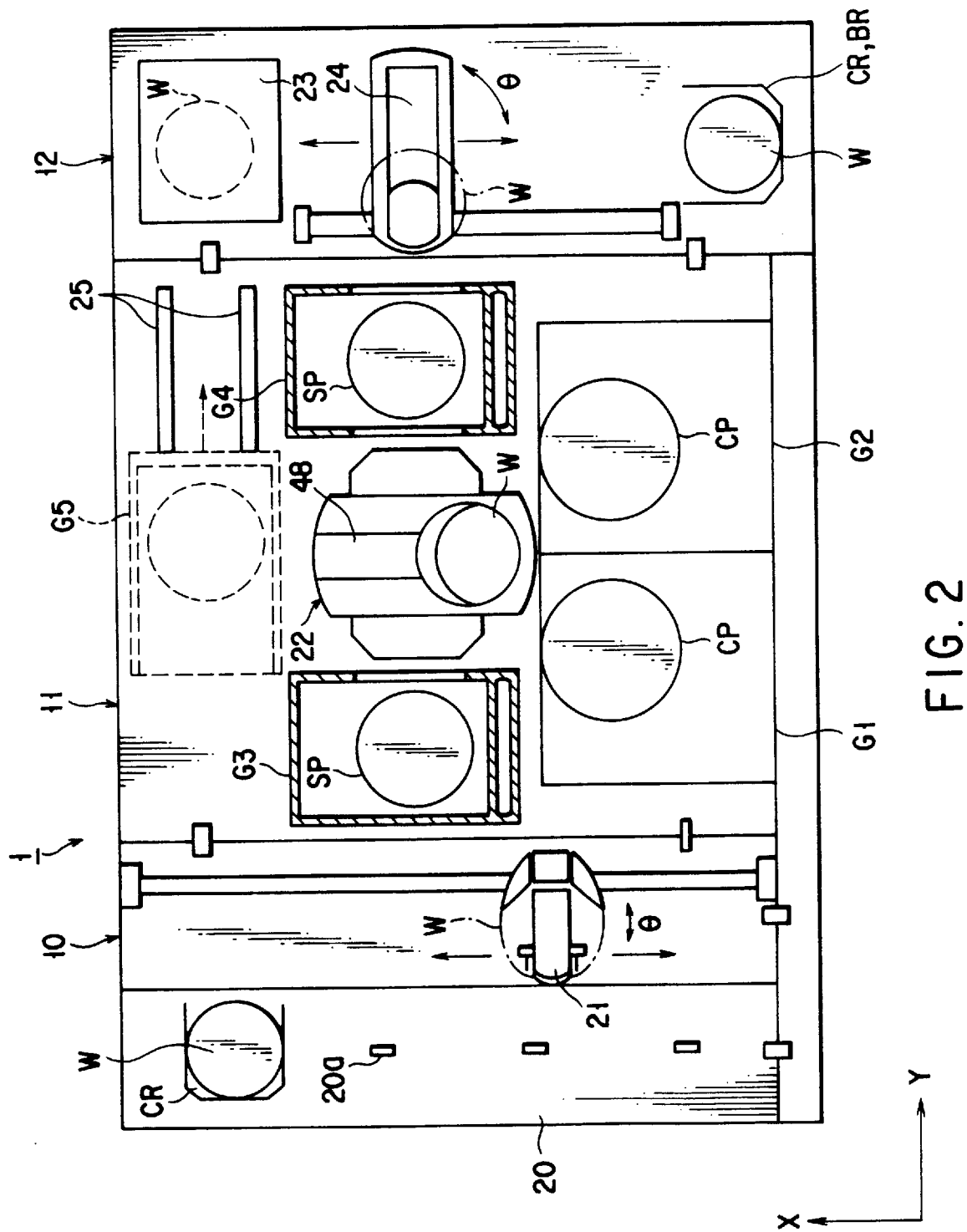
FIG. 2 is a schematic plan view, showing a coating/developing treatment system for semiconductor wafers.

As is shown in FIG. 2, a coating/developing treatment system 1 comprises a cassette section 10, a process section 11, and an interface section 12. The cassette section 10 is located adjacent to the process section 11 and has a first sub arm mechanism 21. In the cassette section 10, wafers W are carried, in units of twenty five ones, into a cassette CR from the outside or out of the cassette CR to the outside. The process section 11 includes a plurality of treatment units for coating the wafers W with a resist, and baking, cooling and developing the coated resist. The interface section 12 is interposed between the process section 11 and an exposure unit (not shown), and has a second sub arm mechanism 24 for carrying the wafers W between the process section 11 and the exposure unit.

The cassette section 10 includes a mounting table 20 which extends in the X-axis direction and has four positioning projections 20a for positioning the cassette CR. The cassette CR is placed on the mounting table 20 such that its opening is directed to the process section 11. In the cassette CR, the wafers W are arranged parallel to each other at regular intervals.

The first sub arm mechanism 21 has an X-axis driving mechanism (not shown) for moving its arm holder in the X-axis direction, a Z-axis driving mechanism (not shown) for moving the arm holder in the Z-axis direction, and an advancing/retreating mechanism (not shown) for advancing and retreating the arm holder. The first sub arm mechanism 21 takes the wafers W one by one out of the cassette CR and transfers them one by one onto a main arm mechanism 22. The first sub arm mechanism 21 has a θ-rotation mechanism (not shown) for rotating the arm holder about the Z-axis. Thus, the first sub arm mechanism 21 can access an alignment unit (ALIM) and an extension unit (EXT), which are included in a third process unit group $G_3$ of the process section 11.

Figure 4:
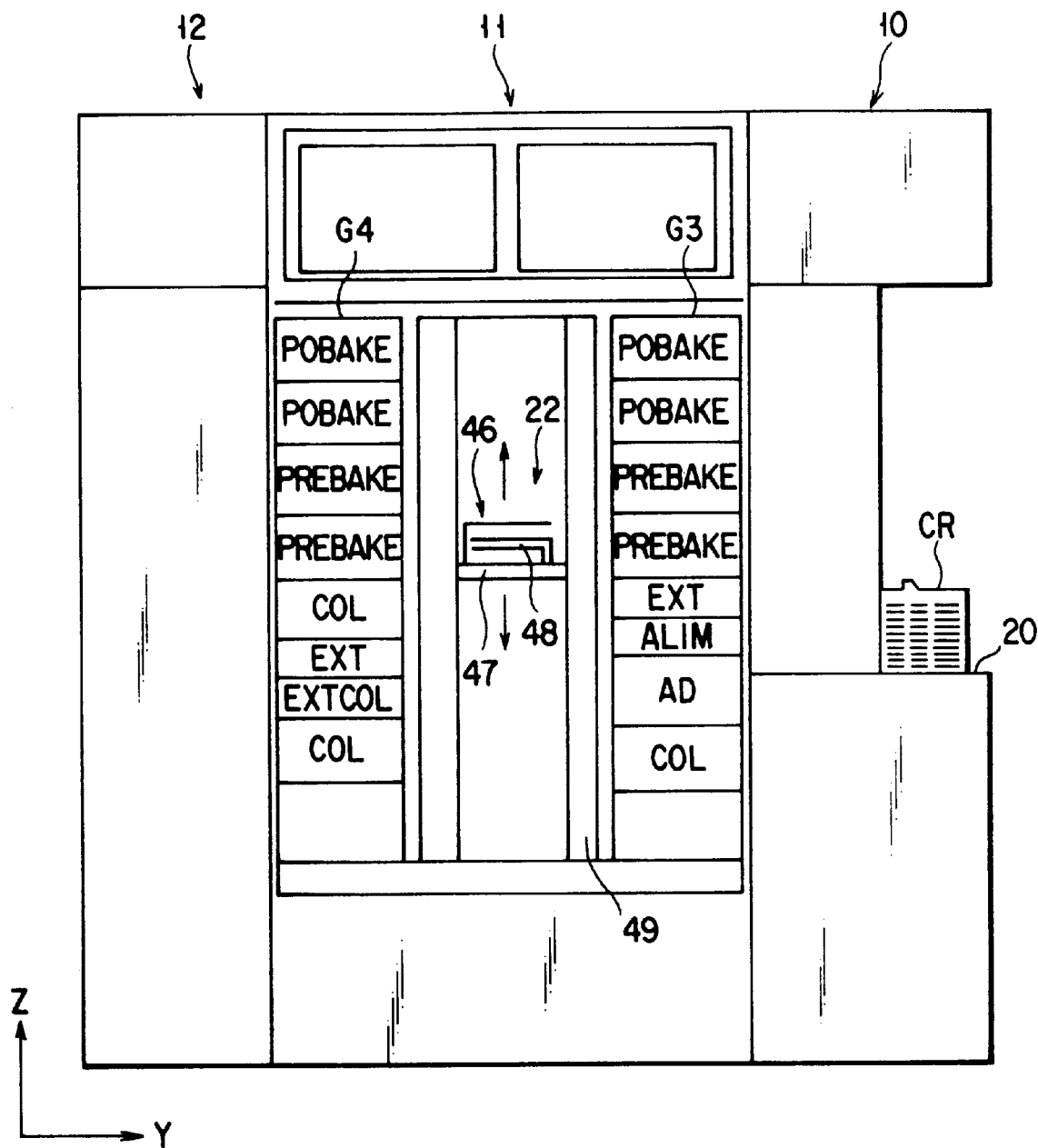
FIG. 4 is a rear view, showing the coating/developing treatment system of FIG. 2.

As is shown in FIG. 4, the main arm mechanism 22 has a cylindrical support member 49 and a wafer transfer unit 46 located inside the cylindrical support member 49. The wafer transfer unit 46 has a Z-axis driving mechanism (not shown) for moving an arm holder 48 in the Z-axis direction, and an advancing/retreating mechanism (not shown) for advancing and retreating the arm holder 48.

The cylindrical support member 49 is coupled with the vertical driving shaft of a motor (not shown), and the wafer transfer unit 46 is disposed to rotate about the driving shaft together with the cylindrical support member 49. As a result, the wafer transfer unit 46 can rotate about the Z-axis through an angle θ. Further, the wafer transfer unit 46 has three arm holders 48. Each arm holder 48 is advanced or retreated by the aforementioned advancing/retreating mechanism (not shown) on a transfer table 47.

As is shown in FIG. 2, the process section 11 includes five process unit groups $G_1$, $G_2$, $G_3$, $G_4$ and $G_5$. Each process unit group has a plurality of process units stacked on each other. The first and second process unit groups $G_1$ and $G_2$ are located at front portions of the system 1. The third process unit group $G_3$ is located adjacent to the cassette section 10, and the fourth process unit group $G_4$ is located adjacent to the interface section 12. Moreover, the preliminary fifth process unit group $G_5$ may be additionally provided at a rear portion of the system 1.

Figure 3:
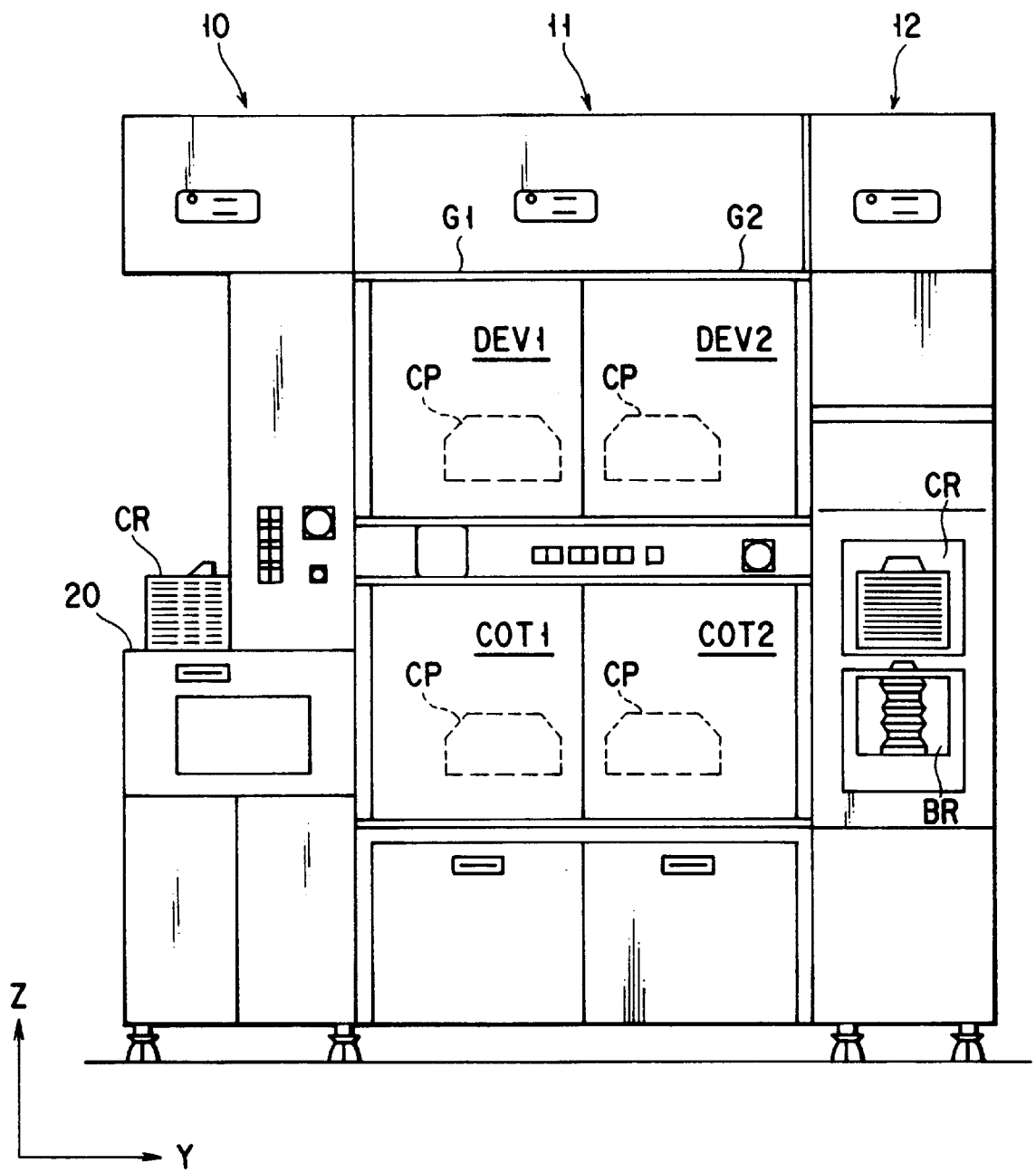
FIG. 3 is a front view, showing the coating/developing treatment system of FIG. 2.

As is shown in FIG. 3, the first and second process unit groups $G_1$ and $G_2$ have a plurality of coating units (COT) for coating each wafer W with a resist, and a plurality of developing units (DEV) for developing the coated resist with a developer. Specifically, in each of the first and second process unit groups $G_1$ and $G_2$, a spinner type developing unit (DEV) is stacked on a spinner type resist coating unit (COT). In other words, the resist coating units (COT) of the first and second process unit groups $G_1$ and $G_2$ are adjacent to each other, while the developing units (DEV) of them are also adjacent to each other. Although it is preferable to locate the resist coating unit (COT) below the developing unit (DEV), they can be arranged reversely.

As is shown in FIG. 4, in the third process unit group $G_3$, eight oven type process units are stacked on one another for applying predetermined treatments to a wafer W placed on a mounting table SP. The process units include, for example, a cooling unit (COL) for performing a cooling treatment, an adhesion unit (AD) for imparting hydrophobic nature to the resist to enhance its adhesion, an alignment unit (ALIM) for positioning, an extension unit (EXT), pre-baking units (PREBAKE) for performing a heat treatment before an exposure treatment, and post-baking units (POBAKE) for performing a heat treatment after the exposure treatment. These units are stacked in this order from the bottom. Similarly, in the fourth process unit group $G_4$, eight oven type process units are stacked on one another. These process units include, for example, a cooling unit (COL), an extension cooling unit (EXTCOL), an extension unit (EXT), a cooling unit (COL), pre-baking units (PREBAKE), and post-baking units (POBAKE). These units are stacked in this order from the bottom.

As described above, the cooling unit (COL) and the extension cooling unit (EXTCOL), which employ lower treatment temperatures, are located in lower positions, while the pre-baking unit (PREBAKE) and the post-baking unit (POBAKE), which employ higher treatment temperatures, are located in upper positions. As a result, thermal interference between the units can be minimized.

The interface section 12 has substantially the same X-axis directional dimension as the process section 11, and a smaller Y-axis directional dimension than it. A movable pick-up cassette CR and a stationary buffer cassette BR are stacked on each other at a front portion of the interface section 12. Further, a peripheral exposure unit 23 is provided at a rear portion of the interface section 12. Moreover, as aforementioned, the interface section 12 includes the second sub arm mechanism 24. The second sub arm mechanism 24 has an X-axis driving mechanism (not shown), a Z-axis driving mechanism (not shown) and a θ rotation mechanism (not shown), and is accessible to the cassettes CR and BR and the peripheral exposure unit 23 in the interface section 12. The second sub arm mechanism 24 is also accessible to the extension unit (EXT) included in the fourth process unit group $G_4$, and to a wafer transfer table (not shown) located on the exposure unit side.

In the process section 11, the fifth process unit group $G_5$ can be added. This process unit group is slidable along a guide rail 25 in the Y-axis direction. Where it is slid along the rail, a space will be defined at the rear side of the main arm mechanism 22, through which space the mechanism 22 can be inspected or repaired easily.

Figure 5:
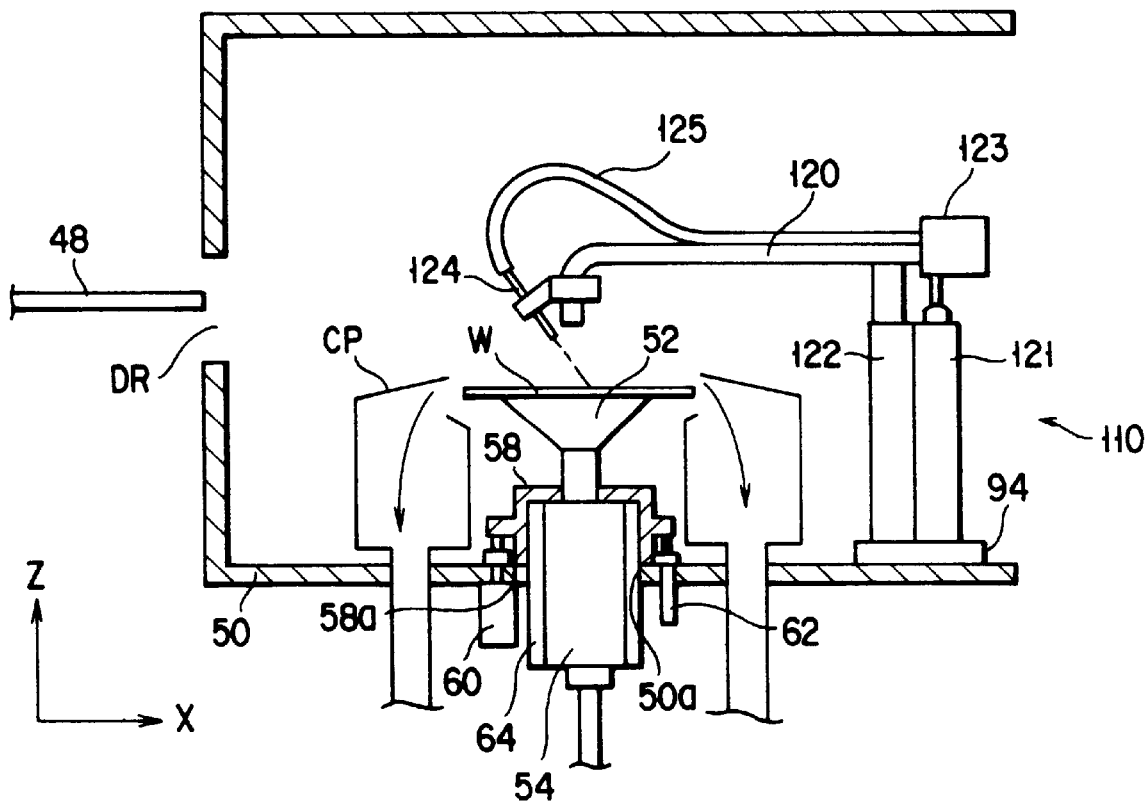
FIG. 5 is a sectional view, showing a resist coating unit.
Figure 6:
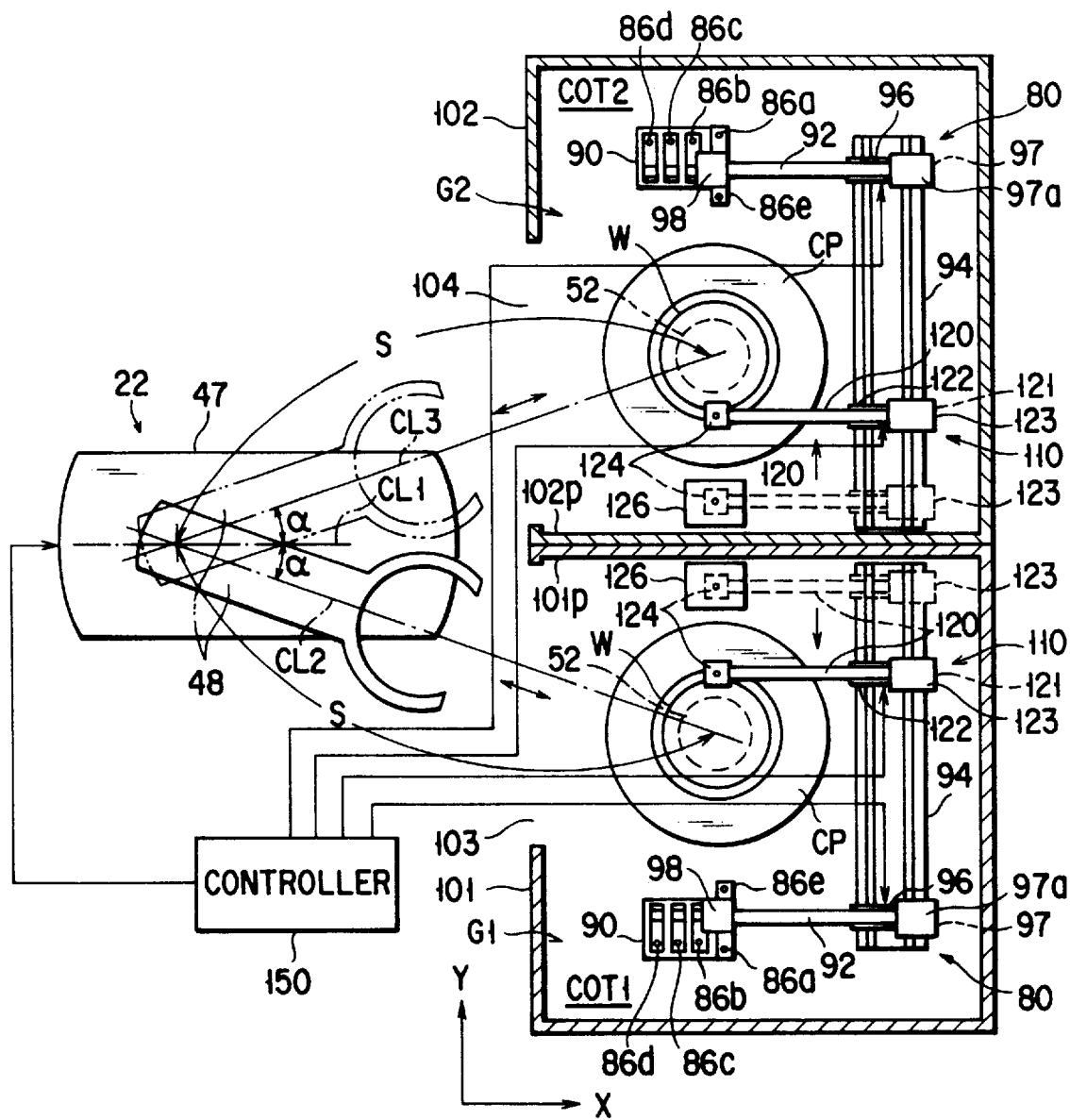
FIG. 6 is a plan view, showing a substrate treatment apparatus according to an embodiment of the invention.

Referring then to FIGS. 5 and 6, each resist coating unit (COT) will be described.

An annular cup CP is provided at a center portion of each resist coating unit (COT), and a spin chuck 52 is provided at a center portion of the annular cup CP. A treatment liquid centrifuged from a rotating wafer W is received by the cup CP and exhausted through a drainage. The cup CP has an upper opening, through which the wafer W is placed on the spin chuck 52. The upper opening of the cup CP is closeable with a cover (not shown). The upper surface of the spin chuck 52 has a hole which communicates with a vacuum exhaustion mechanism (not shown). The wafer W is held on the spin chuck 52 by a vacuum force which acts through the hole.

Figure 7:
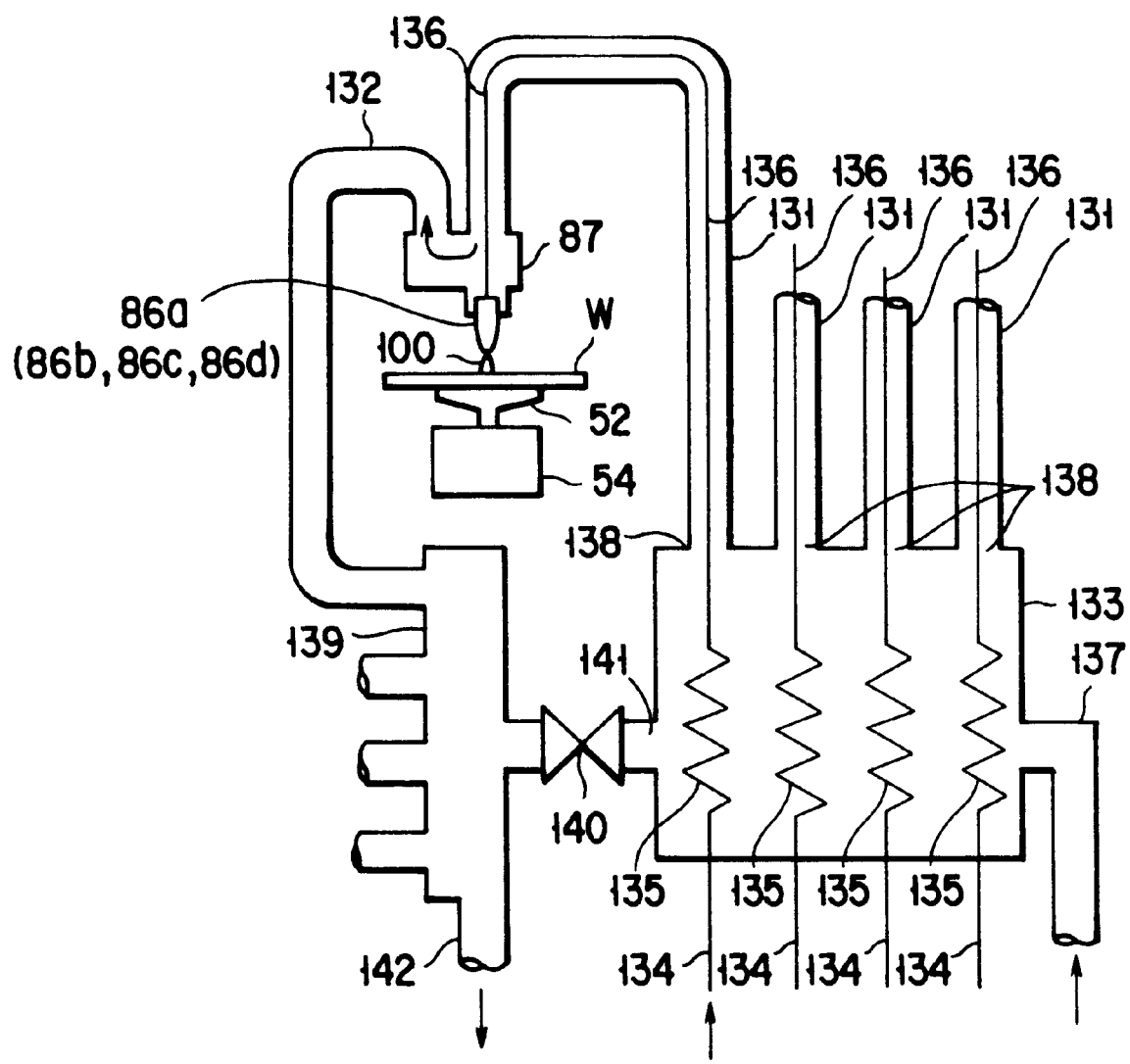
FIG. 7 is a view, useful in explaining a resist supply circuit.

As is shown in FIG. 7, a lower portion of the spin chuck 52 is coupled with the driving shaft of a motor 54 so that the spin chuck can rotate about its vertical axis. A power supply circuit for the motor 54 is connected to the output side of a controller 150, so that the rotational speed and rotation period of the spin chuck 52 can be controlled.

As is shown in FIG. 5, the motor 54 is located through an opening 50a formed in a unit bottom plate 50. An aluminum flange cap 58 covers an upper portion of the motor 54. Through the flange cap 58, the motor 54 is coupled with an air cylinder 60 and a vertically movable guide 62. A stainless cooling jacket 64 is attached to the peripheral surface of the motor 54. The flange cap 58 also covers an upper portion of the cooling jacket 64. The power supply circuits for the motor 54 and the cylinder 60 are connected to the output side of the controller 150 as shown in FIG. 6.

At the time of resist coating, the lower end 58a of the flange cap 58 is in tight contact with the unit bottom plate 50 around the opening 50a, thereby keeping the interior of the unit (COT) in an airtight manner. At the time of transfer of the wafer W, a rod is made to project from the cylinder 60 to raise the spin chuck 52, lift pins (not shown) are made to project from the spin chuck 52 to raise the wafer W, and arm holder 48 of the main arm mechanism 22 is inserted under the raised wafer W, and the lift pins are lowered. Thus, the wafer W is transferred onto the holder 48.

Referring then to FIG. 6, a resist coating unit (COT1) included in the first process unit group $G_1$, and a resist coating unit (COT2) included in the second process unit group $G_2$ will be described in more detail.

The first resist coating unit (COT1) is surrounded with a casing 101 having an opening 103, through which the wafer W is transferred into the casing 101 by the arm holder 48 of the main arm mechanism 22. Similarly, the second resist coating unit (COT2) is surrounded with a casing 102 having an opening 104, through which the wafer W is transferred into the casing 102 by the arm holder 48 of the main arm mechanism 22. The openings 103 and 104 are located adjacent to partition plates 101a and 102a, respectively, which partition the first and second resist coating units. Further, these openings are arranged at the same distance from the main arm mechanism 22 and symmetrical with respect thereto, and each have an openable/closeable shutter (not shown).

In the cases 101 and 102, the cups CP, the spin chucks 52, first and second nozzle stand-by sections 90 and 126, and first and second nozzle operating mechanisms 80 and 120 are arranged at the same distance from the main arm mechanism 22 and symmetrical with respect thereto. More specifically, corresponding elements in the first and second units (COT1, COT2) are arranged symmetrical with respect to a center line CL1 which is parallel to the X-axis. Accordingly, the stroke S and the swing angle α of the arm holder 48 of the main arm mechanism 22 can be set to the same values when it transfers the wafer W into the first unit (COT1) and into the second unit (COT2). The swing angle α indicates the angle formed between the center line CL1 (parallel to the X-axis) and a center line CL2 or a center line CL3.

The first cup CP and spin chuck 52 are located near the opening 103, while the second cup CP and spin chuck 52 are located near the opening 104. Accordingly, the arm holder 48 of the main arm mechanism 22 can transfer the wafer W onto the first and second spin chuck 52 by taking the shortest distance.

The first and second nozzle operating mechanisms 80 and 110 are supported by driving mechanisms 96 and 122, respectively, so that they can move along respective guide rails 94. Each of the guide rails 94 is located on the bottom plate 50 behind the cup CP and extends in the Y-axis direction. The first driving mechanism 96 has built-in X-axis driving means, Y-axis driving means and Z-axis driving means (which are not shown) for driving a horizontal arm 92 in the X-, Y- and Z-axis directions in response to an instruction signal from the controller 150. Similarly, the second driving mechanism 122 has built-in X-axis driving means, Y-axis driving means and Z-axis driving means (which are not shown) for driving a horizontal arm 120 in the X-, Y- and Z-axis directions in response to an instruction signal from the controller 150. The arms 92 and 120 extend in the X-axis direction. The first arm 92 has a free end with a chuck holder 98, while the second arm 120 has a free end with a rinse nozzle 124.

Four nozzles 86a–86d of each nozzle stand-by section are provided for supplying different kinds of liquid resists. A separate nozzle 86e is for supplying a solvent (thinner). Another separate nozzle 124 is provided for side rinsing. The rinse nozzle 124 communicates with a rinse supply section (not shown) via a supply pipe 125, and is supplied with the solvent (thinner) as a rinse.

Each nozzle 86a–86d is picked up from the first stand-by section 90 by the chuck holder 98, and transferred from the home position (i.e. from the first stand-by section 90) to a position for use (i.e. above the center of the wafer W mounted on the spin chuck).

The cup CP and the spin chuck 52 are placed in a position directly opposite to the opening 103 (104) and at a substantially central portion of the casing 101 (102). The first stand-by section 90 is slightly separated from the opening 103 (104) in the vicinity of one side wall of the casing 101 (102). The second stand-by section 126 is slightly separated from the opening 103 (104) in the vicinity of the other side wall of the casing 101 (102). In other words, the cup CP is interposed between the first and second stand-by sections 90 and 126.

Figure 8:
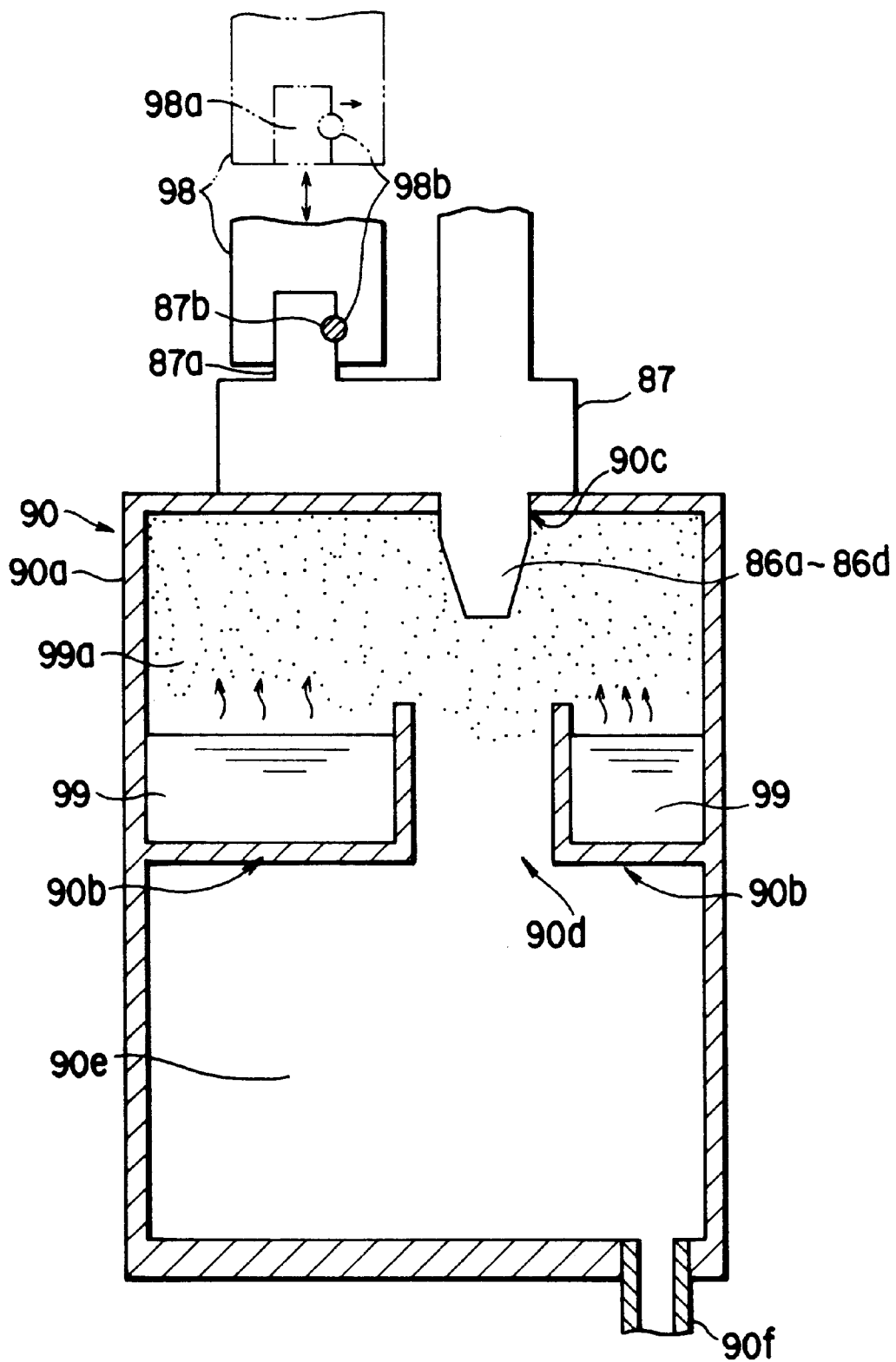
FIG. 8 is a sectional view, showing a nozzle stand-by vessel.

The chuck holder 98 is adapted to select and pick up one of the four nozzles 86a–86d which stand by in the first nozzle stand-by section 90. As is shown in FIG. 8, when the nozzle holder 98 is lowered from an air cylinder (not shown), a lower concave portion 98a of the holder 98 is engaged with a convex portion 87a of each nozzle jacket 87 which is attached to a corresponding one of the nozzles 86a–86d, and a projectable lock pin 98b built in the holder 98 is fitted in a small depression 87b in the nozzle jacket 87. As a result, the nozzle holder 98 is tightly coupled with the nozzle jacket 87. When in this state, the nozzle holder 98 is raised, the first resist nozzle 86a, for example, is raised from the stand-by section 90 together with the holder 98. Thus, an appropriate one of the four nozzles 86a–86d is selected.

Each nozzle jacket 87 has a temperature adjusting unit (which will be described later) for adjusting the temperature of a liquid resist in the nozzle. Further, the nozzle holder 98 has an exhaustion mechanism (not shown) for exhausting, to the outside of the clean room via an internal passage (not shown), dust particles which will rise from a sliding portion of, for example, the air cylinder.

The chuck holder 98 is provided with the thinner nozzle 86e, which communicates with a thinner supply (not shown) via a supply pipe (not shown) for supplying thinner as a solvent of the resist. The four resist nozzles 86a–86d are arranged in the X-axis direction in the first nozzle stand-by section 90. The thinner nozzle 86e is attached to a side portion of the chuck holder 98 so that it will not interfere the pick-up of the resist nozzles 86a–86d.

On the other hand, in the second nozzle stand-by section 126, the rinse nozzle 124 is kept in the standby state when it is not used. The second nozzle stand-by section 126 also includes a drain cup (not shown) for collecting a rinse which drips from the rinse nozzle 124.

As is shown in FIG. 5, the second nozzle operating mechanism 110 has a shock absorber 121. An upper end portion of the shock absorber 121 is completely or roughly coupled with a rear end portion of the horizontal arm 120, and covered with a cover 123. Similarly, the first nozzle operating mechanism 80 has a shock absorber 97, which has an upper end portion completely or roughly coupled with a rear end portion of the horizontal arm 92 and covered with a cover 97a.

Referring now to FIG. 7, the liquid resist supply circuit and the temperature adjusting unit for the resist nozzles will be described, taking the first resist nozzle 86a as an example.

An inlet and an outlet of the jacket 87 for temperature adjusting water are connected to an end of a hose 131 and an end of a hose 132, respectively. The other end of the hose 131 is connected to the outlet 138 of a temperature adjusting unit 133, and the other end of the hose 132 to a manifold 139. The manifold 139 has a valve 140 and a drain 142. The manifold 139 communicates with the temperature adjusting unit 133 via the valve 140 for returning the temperature adjusting water to the temperature adjusting unit 133. Moreover, part of the temperature adjusting water in the manifold 139 is exhausted through the drain 142.

The temperature adjusting unit 133 includes four liquid supply systems. A first liquid supply system comprises the first nozzle 86a, liquid resist supply tubes 134 and 136 and heat exchanger 135. The tube 136 is located downstream of the heat exchanger 135, and inserted in the hose 131. The tube 134 is located upstream of the heat exchanger 135 communicates with a corresponding one of four resist liquid supply units (not shown) which contain different kinds of liquid resists.

Referring then to FIG. 8, the first nozzle standby section 90 will be described.

The first nozzle stand-by section 90 includes a vessel 90a which has a solvent bath 90b located at vertically middle portion thereof and containing an organic solvent. An upper portion 99a of the vessel 90a is filled with vapor of the solvent contained in the bath. Four openings 90c are formed in the upper surface of the vessel 90a. The discharge ports of the nozzles 86a–86d are inserted in the four openings 90c, respectively, such that the discharge ports are exposed to the solvent vapor in the upper portion 99a so as to prevent the liquid resist from solidifying or degrading at the discharge ports.

An opening 90d is formed in the solvent bath 90b such that the upper portion 90a of the vessel 90 communicates with a lower portion 90b of it. The opening 90d is located just below the openings 90c through which the nozzles 86a–86d are inserted. Liquid drips dripping from the nozzles 86a–86d in the stand-by state reach the lower portion 90e through the opening 90d and are exhausted therefrom through a drain 90f.

Figure 9:
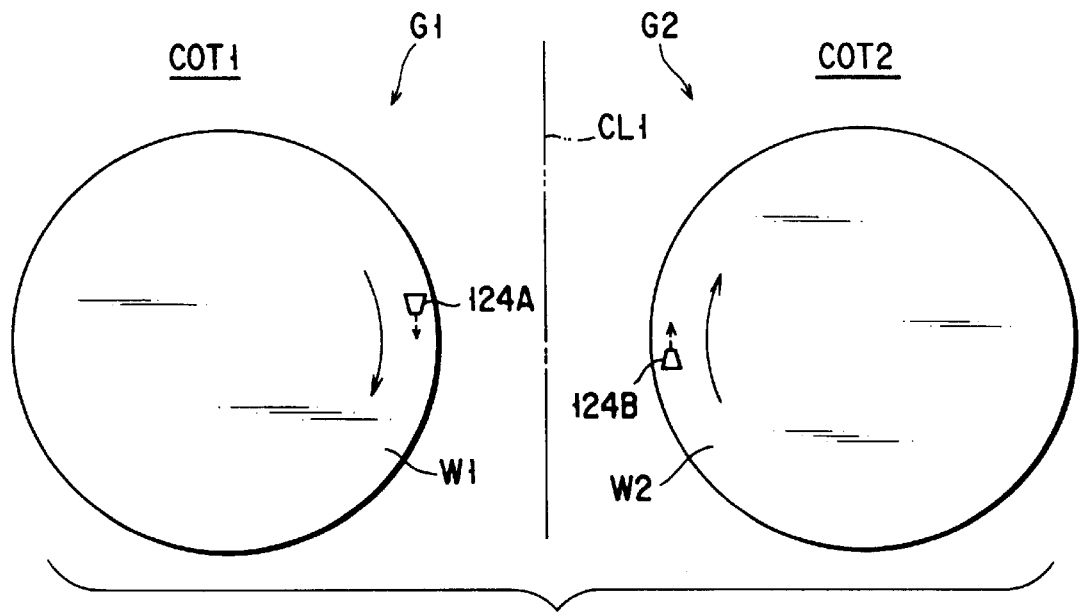
FIG. 9 is a view, useful in explaining the operations of rinse nozzles incorporated in adjacent two resist coating units.

As is shown in FIG. 9, wafer W1 and W2 respectively placed in the resist coating units (COT1, COT2) of the first and second process unit groups $G_1$ and $G_2$ are rotated clockwise. Side rinse nozzles 124A and 124B respectively provided in the first and second resist coating units (COT1, COT2) are arranged such that a rinse is discharged to edge areas of the wafers W1 and W2 in accordance with the rotation of the wafers. To this end, the discharge ports of the side rinse nozzles 124A and 124B face opposite directions. As a result, the side rinse nozzles 124 are arranged point symmetrical, whereas all the other elements of the first and second units (COT1, COT2) are arranged symmetrical with respect to the line CL1.

Since as described above, almost all elements of the first and second units (COT1, COT2) are arranged symmetrical with respect to the line CL1, the access angle α and the transfer stroke S of the arm holder 48 can be set identical when the holder transfers a wafer to the first unit (COT1) and to the second unit (COT2), as is shown in FIG. 6. This means that the wafer transfer unit 46 can access each unit under the same access conditions, and hence that the main arm mechanism 22 can be made simple in both hardware and software.

Moreover, since in the above-described apparatus, the wafers W1 and W2 are rotated in the same direction and the side rinse nozzles 124A and 124B are made to face opposite directions, the rinse is discharged in the same direction between the wafers W1 and W2 in the adjacent units (COT1, COT2). Therefore, even when rinse treatment errors occur in the adjacent units (COT1, COT2), they occur in the same direction and hence can be dealt with easily.

Figure 10:
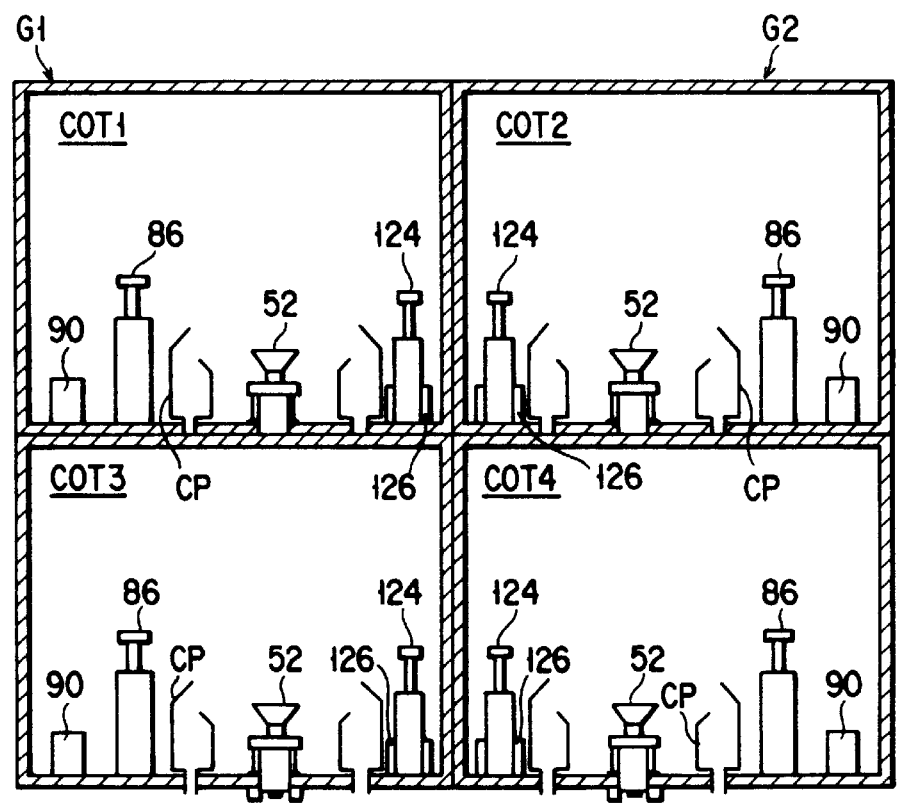
FIG. 10 is a sectional view, showing a substrate treatment apparatus according to another embodiment of the invention.

The apparatus may be modified as shown in FIG. 10 such that the first resist coating unit (COT1) is stacked on the third resist coating unit (COT3) in the first process unit group $G_1$, and the second resist coating unit (COT2) is stacked on the fourth resist coating unit (COT4) in the second process unit group $G_2$. In this case, the first resist coating unit (COT1) and the second resist coating unit (COT2) are arranged symmetrical, while the third resist coating unit (COT3) and the fourth resist coating unit (COT4) are arranged symmetrical. Increasing resist coating units (COT) and arranging them in a manner as above can remarkably increase the throughput of the resist coating process.

Figure 11:
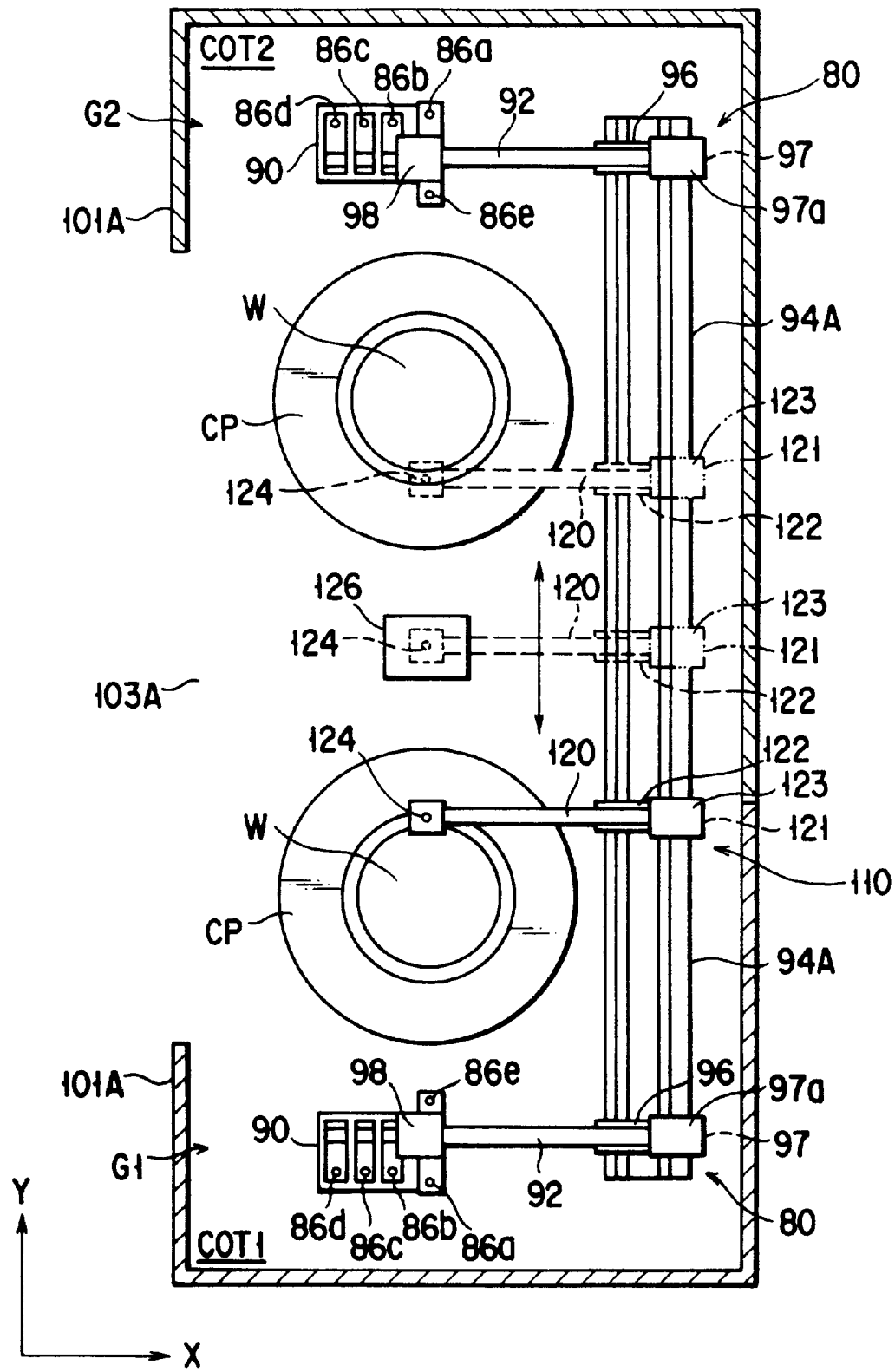
FIG. 11 is a plan view, showing a substrate treatment apparatus according to a further embodiment of the invention.

In addition, the apparatus may be modified as shown in FIG. 11 such that a single side rinse section (124, 126) is commonly used in the adjacent first and second units (COT1, COT2). More specifically, the units (COT1, COT2) are contained in a single casing 101A with no partition, and a single nozzle stand-by section 126 is provided between the first and second cups CP. In the nozzle stand-by section 126, the commonly used side rinse nozzle 124 is made to stand by. Further, the first and second nozzle operating mechanisms 80 and 110 commonly use a single guide rail 94A. This structure can reduce the space for the process section 11 and hence the size of the apparatus.

The invention is not limited to the resist coating unit (COT), but also applicable to the developing unit (DEV). Furthermore, the substrate to be treated is not limited to the above-described semiconductor wafer, but may be other kinds of substrates such as an LCD substrate, a glass substrate, a CD substrate, a photomask, a printed substrate, a ceramic substrate, etc.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

I claim:

1. A substrate treatment apparatus comprising:
    an arm holder for substantially horizontally holding each of substrates to be treated;
    a substrate transfer mechanism, having a vertical shaft, for moving the arm holder along the vertical shaft, swinging the arm holder about the vertical shaft, and horizontally advancing and retreating the arm holder;
    a controller for controlling the operation of the substrate transfer mechanism;
    a first liquid process unit including a casing, a substrate carry-in/carry-out port formed in the casing and permitting a first substrate to be carried therethrough together with the arm holder, and a plurality of treatment members contained in the casing for treating the first substrate with a liquid; and
    a second liquid process unit located adjacent to the first liquid process unit, and including the casing, a substrate carry-in/carry-out port formed in the casing and permitting a second substrate to be carried therethrough together with the arm holder, and a plurality of treatment members contained in the casing for treating the second substrate with a liquid;
    wherein each of the treatment members of the first liquid process unit and a corresponding one of the treatment members of the second liquid process unit are arranged symmetrical on a horizontal plane with respect to the arm holder.

2. The apparatus according to claim 1, wherein
    the treatment members of the first liquid process unit include a first spin chuck and a first side rinse nozzle;
    the treatment members of the second liquid process unit include a second spin chuck and a second side rinse nozzle, discharge ports of the first and second side rinse nozzles facing opposite directions; and
    a rinse is applied to an edge portion of a first substrate by the first side rinse nozzle while the first substrate is rotated by the first spin chuck in a direction, and a rinse is applied to an edge portion of a second substrate by the second side rinse nozzle while the second substrate is rotated by the second spin chuck in the same direction as that of the first substrate.

3. The apparatus according to claim 1, further comprising a side rinse nozzle commonly used by the first and second liquid process units.

4. The apparatus according to claim 3, further comprising first and second spin chucks contained in the single casing without a partition between the first and second liquid process units, and a nozzle stand-by section situated between the first and second spin chucks and permitting the common side rinse nozzle to stand by therein.

5. The apparatus according to claim 1, further comprising a third liquid process unit stacked on the first liquid process unit, and a fourth liquid process unit stacked on the second liquid process unit, and wherein the third and fourth liquid process units are arranged, on a horizontal plane, adjacent to each other and symmetrical with respect to the arm holder.

6. A substrate treatment apparatus comprising:
    an arm holder for substantially horizontally holding each of substrates to be treated;
    a substrate transfer mechanism, having a vertical shaft, for moving the arm holder along the vertical shaft, swinging the arm holder about the vertical shaft, and horizontally advancing and retreating the arm holder;
    a first liquid process unit including a casing, and a substrate carry-in/carry-out port formed in the casing and permitting a first substrate to be carried therethrough together with the arm holder;
    a first spin chuck included in the first liquid process unit for rotating the first substrate transferred from the arm holder;

a first cup surrounding the first spin chuck;

a movable first nozzle section included in the first liquid process unit for applying a treatment liquid to the first substrate on the first spin chuck to treat it;

a first nozzle stand-by section in which the first nozzle section stands by when it is not used;

a first nozzle operating mechanism for moving the first nozzle section between the first nozzle stand-by section and the first spin chuck;

a second liquid process unit located adjacent to the first liquid process unit and symmetrical in a horizontal plane with respect to the arm holder, and including a casing and a substrate carry-in/carry-out port formed in the casing and permitting a first substrate to be carried therethrough together with the arm holder;

a second spin chuck included in the second liquid process unit for rotating the substrate transferred from the arm holder;

a second cup surrounding the second spin chuck;

a movable second nozzle section included in the second liquid process unit for applying a treatment liquid to the substrate on the second spin chuck to treat it;

a second nozzle stand-by section in which the second nozzle section stands by when it is not used; and a second nozzle operating mechanism for moving the second nozzle section between the second nozzle stand-by section and the second spin chuck;

wherein the first spin chuck, the first cup, the first nozzle section, the first nozzle stand-by section and the first nozzle operating mechanism, and the second spin chuck, the second cup, the second nozzle section, the second nozzle stand-by section and the second nozzle operating mechanism are arranged symmetrical in a horizontal plane with respect to the arm holder, respectively.

7. The apparatus according to claim 6, wherein the first liquid process unit has a first side rinse nozzle; the second liquid process unit has a second side rinse nozzle; the first and second side rinse nozzles have liquid discharge ports which face opposite directions; a rinse is applied to an edge portion of a first substrate by the first side rinse nozzle while the first substrate is rotated by the first spin chuck in a direction; and a rinse is applied to an edge portion of a second substrate by the second side rinse nozzle while the second substrate is rotated by the second spin chuck in the same direction as that of the first substrate.

8. The apparatus according to claim 7, further comprising a third nozzle stand-by section in which the first side rinse nozzle stands by, and a fourth nozzle stand-by section in which the second side rinse nozzle stands by, the third and fourth nozzle stand-by sections being arranged symmetrical in a horizontal plane with respect to the arm holder.

9. The apparatus according to claim 8, wherein the third nozzle stand-by section is located in the vicinity of the substrate carry-in/carry-out port of the first liquid process unit and also in the vicinity of one of side walls of the casing; and the fourth nozzle stand-by section is located in the vicinity of the substrate carry-in/carry-out port of the second liquid process unit and also in the vicinity of the other of the side walls.

10. The apparatus according to claim 8, wherein the first spin chuck is located between the first and third nozzle stand-by sections, and the second spin chuck is located between the second and fourth nozzle stand-by sections.

11. The apparatus according to claim 6, further comprising a side rinse nozzle commonly used by the first and second liquid process units.

12. The apparatus according to claim 8, wherein the first nozzle stand-by section is located at a distance from the substrate carry-in/carry-out port of the first liquid process unit and in the vicinity of one of side walls of the casing; and the second nozzle stand-by section is located at a distance from the substrate carry-in/carry-out port of the second liquid process unit and in the vicinity of the other of the side walls.

13. The apparatus according to claim 6, wherein the first spin chuck is located directly in front of the substrate carry-in/carry-out port of the first liquid process unit and at a center portion of the casing; and the second spin chuck is located directly in front of the substrate carry-in/carry-out port of the second liquid process unit and at a center portion of the casing.

14. The apparatus according to claim 6, further comprising a third liquid process unit stacked on the first liquid process unit, and a fourth liquid process unit stacked on the second liquid process unit, and wherein the third and fourth liquid process units are arranged, on a horizontal plane, adjacent to each other and symmetrical with respect to the arm holder.

15. The apparatus according to claim 6, wherein there is no partition between the first and second liquid process units, and the first and second nozzle operating mechanisms are contained in a single casing and have a common guide rail.

16. The apparatus according to claim 6, wherein the first and second nozzle sections each have a plurality of nozzles for discharging different kinds of liquid resists.

17. The apparatus according to claim 6, wherein the substrate to be treated is a semiconductor wafer, and the treatment liquid is a liquid resist to be coated on the semiconductor wafer.

18. The apparatus according to claim 6, wherein the substrate to be treated is a semiconductor wafer, and the treatment liquid is a developer for developing a resist coated on the semiconductor wafer.

19. The apparatus according to claim 6, wherein the first and second cups are located in the casing of the first liquid process unit and in the casing of the second liquid process unit, respectively, such that the first and second cups are arranged close to each other.

* * * * *